(12) United States Patent
Choi et al.

(10) Patent No.: US 12,482,781 B2
(45) Date of Patent: Nov. 25, 2025

(54) SUBSTRATES WITH SPACERS, INCLUDING SUBSTRATES WITH SOLDER RESIST SPACERS, AND ASSOCIATED DEVICES, SYSTEMS, AND METHODS

(71) Applicant: Micron Technology, Inc., Boise, ID (US)

(72) Inventors: Bong Woo Choi, Singapore (SG); Venkateswarlu Bhavanasi, Singapore (SG); Wen How Sim, Singapore (SG); Harjashan Veer Singh, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 558 days.

(21) Appl. No.: 17/899,522

(22) Filed: Aug. 30, 2022

(65) Prior Publication Data
US 2024/0071975 A1  Feb. 29, 2024

(51) Int. Cl.
*H01L 23/00* (2006.01)
*H01L 21/48* (2006.01)
(Continued)

(52) U.S. Cl.
CPC ........ *H01L 24/32* (2013.01); *H01L 21/4846* (2013.01); *H01L 21/563* (2013.01); *H01L 23/49894* (2013.01); *H01L 24/16* (2013.01); *H01L 24/27* (2013.01); *H01L 24/48* (2013.01); *H01L 24/73* (2013.01); *H01L 25/0652* (2013.01); *H01L 2224/16227* (2013.01); *H01L 2224/16238* (2013.01); *H01L 2224/26165* (2013.01); *H01L 2224/27005* (2013.01); *H01L 2224/27515* (2013.01); *H01L 2224/32145* (2013.01); *H01L 2224/32225* (2013.01); *H01L 2224/48229* (2013.01); *H01L 2224/73204* (2013.01); *H01L 2224/73253* (2013.01);
(Continued)

(58) Field of Classification Search
CPC .... H01L 21/563; H01L 21/4846; H01L 24/32
See application file for complete search history.

(56) References Cited

U.S. PATENT DOCUMENTS

| | | | |
|---|---|---|---|
| 6,930,378 B1 * | 8/2005 | St. Amand | H01L 25/0657 257/691 |
| 2009/0001606 A1 * | 1/2009 | Tamadate | H01L 24/32 257/778 |

(Continued)

*Primary Examiner* — Errol V Fernandes
(74) *Attorney, Agent, or Firm* — Dorsey & Whitney LLP

(57) ABSTRACT

Substrates with spacers, including substrates with solder resist spacers, and associated devices, systems, and methods are disclosed herein. In one embodiment, a substrate comprises a first surface, a solder resist layer disposed over at least a portion of the first surface, and a plurality of electrical contacts at the first surface of the substrate. Electrical contacts of the plurality are configured to be coupled to corresponding electrical contacts at a surface of an electronic device. The substrate further includes a solder resist spacer disposed on the solder resist layer. The solder resist spacer can have a height corresponding to a thickness of the electronic device. The solder resist spacer can be configured as a dam to limit bleed out of underfill laterally away from the plurality of electrical contacts along the first surface and toward the solder resist spacer.

20 Claims, 4 Drawing Sheets

(51) Int. Cl.
*H01L 21/56* (2006.01)
*H01L 23/498* (2006.01)
*H01L 25/065* (2023.01)

(52) U.S. Cl.
CPC ............... *H01L 2224/73265* (2013.01); *H01L 2924/1431* (2013.01); *H01L 2924/1438* (2013.01); *H01L 2924/35121* (2013.01)

(56) References Cited

U.S. PATENT DOCUMENTS

| | | | | |
|---|---|---|---|---|
| 2009/0294162 A1* | 12/2009 | Jeong | ..................... | H05K 3/305 |
| | | | | 427/535 |
| 2014/0126166 A1* | 5/2014 | Kim | ....................... | H05K 3/303 |
| | | | | 156/247 |
| 2020/0135606 A1* | 4/2020 | Pan | ......................... | H01L 24/96 |

* cited by examiner

SUBSTRATES WITH SPACERS, INCLUDING SUBSTRATES WITH SOLDER RESIST SPACERS, AND ASSOCIATED DEVICES, SYSTEMS, AND METHODS

TECHNICAL FIELD

The present disclosure generally relates to substrates with spacers, such as substrates for semiconductor systems and/or devices. For example, several embodiments of the present technology relate to substrates with solder resist spacers for dispensing underfill epoxy and/or stacking semiconductor devices in a semiconductor package.

BACKGROUND

Underfill is a polymer or liquid epoxy that is commonly applied underneath key components of a module to strengthen electrical connections (e.g., solder joints) and reinforce the module's resistance against shock, vibratory stress, and thermal stress. For example, a chip or controller can be positioned on a top surface of a carrier or substrate, and electrical contacts on a bottom surface of the chip/controller can be electrically coupled to electrical contacts on the top surface of the substrate (e.g., using solder balls). Underfill can be applied between (a) the bottom surface of the chip/controller and (b) the top surface of the substrate to, for example, protect or reenforce the electrical connections between the chip/controller and the substrate. Continuing with this example, the underfill can be flown through and around the electrical connections. While flowing underfill, limiting (a) lateral spread (known as bleed out) of the underfill material away from the chip/controller and (b) spread (known as creep) of the underfill on top of the chip/controller has proven difficult.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

The following disclosure describes substrates with spacers and associated systems, devices, and methods. For example, a system of the present technology can include a substrate and a first electronic device (e.g., a NAND die, a controller, etc.) mounted on the substrate. Underfill can be dispensed and flown underneath the first electronic device and between the first electronic device and the substrate to protect or reenforce electrical connections formed between the first electronic device and the substrate. The substrate can also include a spacer (e.g., formed of solder resist) that is positioned at a location laterally offset from the first electronic device. The spacer can be configured as a dam to limit spread of underfill laterally along the surface of the substrate while the underfill is dispensed and flown beneath the first electronic device. A second electronic device can be stacked on top of the spacer and the first electronic device. Thus, the spacer can be sized such that a top surface of the spacer is generally level or flush with a top surface of the first electronic device when the first electronic device is mounted onto the substrate.

A. Overview

Figure 1:
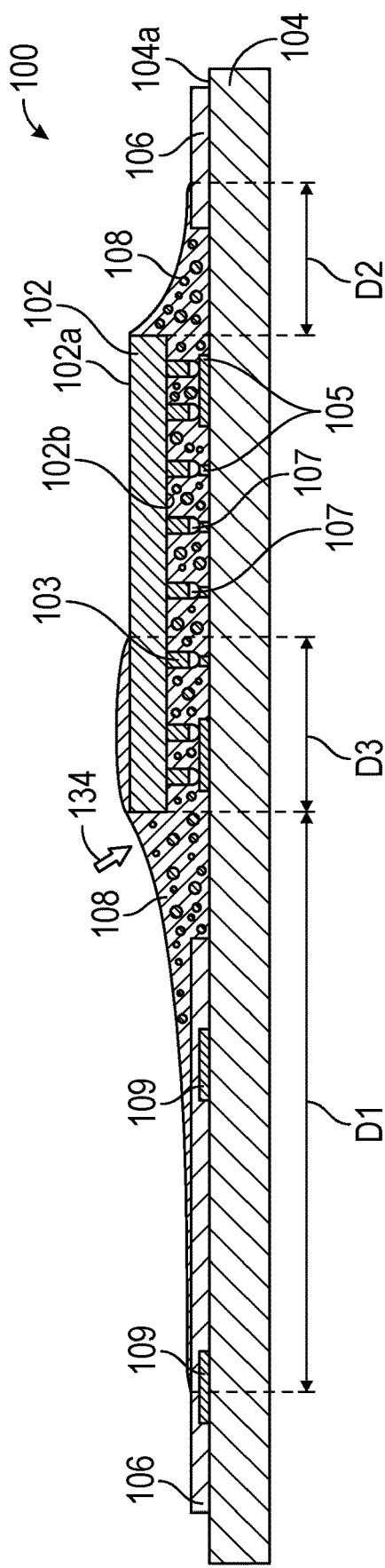
FIG. 1 is a partially schematic side view of a system having an electronic device mounted on a substrate.

As discussed above, underfill is commonly applied underneath key components of a module to, for example, strengthen electrical connections between the key components and a carrier or substrate on which the key components are mounted. While flowing underfill, limiting (a) lateral spread (bleed out) of the underfill material away from the key components and (b) spread (creep) of the underfill on top of the key components has proven difficult. For example, FIG. 1 is a partially schematic side view of a system 100 having an electronic device 102 mounted on a top surface 104a of a substrate 104. As shown, the electronic device 102 includes electrical contacts 103 disposed on (or exposed through) a bottom surface 102b of the electronic device 102, and the substrate 104 includes electrical contacts 105 disposed on (or exposed through) the top surface 104a of the substrate. Electrical connectors 107 (e.g., solder balls, solder joints, etc.) are used to electrically couple the electrical contacts 103 to corresponding ones of the electrical contacts 105. Underfill 108 is then dispensed (from a location generally shown by arrow 134) and flown underneath the electronic device 102 to, for example, protect and reinforce the electrical connections formed between the electrical contacts 103 and the electrical contacts 105.

While flowing the underfill 108, at least a portion of the underfill 108 tends to spread or bleed out laterally away from the electronic device 102. As shown in FIG. 1, the underfill 108 has bled out a distance D1 to the left of the electronic device 102 and a distance D2 to the right of the electronic device 102. Additionally, or alternatively, while flowing the underfill 108, a portion of the underfill 108 can spread or creep onto or over a top surface 102a of the electronic device 102, especially as electronic devices 102 become thinner. As shown in FIG. 1, the underfill 108 has crept a distance D3 onto the top surface 102a of the electronic device 102.

Underfill 108 that has bled out or crept represents an amount of underfill 108 that is not positioned underneath the electronic device 102. In other words, bleed out or creep of the underfill 108 can require application of additional underfill 108 onto the system 100 to ensure an adequate amount of the underfill 108 is positioned beneath the electronic device 102 to protect/reenforce the electrical connections between the electrical contacts 103 and the electrical contacts 105. Application of additional underfill 108 can lengthen the underfill flowing process, and which can reduce throughput of the number of systems per hour undergoing a complete underfill flowing process.

In addition, bleed out and/or creep of the underfill 108 beyond specified limits or tolerances (e.g., a maximum bleed out of 900 μm from a side of the electronic device 102 at which the underfill 108 is dispensed; a maximum bleed out of 500 μm from a side of the electronic device 102 at which the underfill 108 exits from underneath the electronic device 102, such as a side of the electronic device 102 opposite the side at which the underfill 108 is dispensed; and/or a maximum creep of 200 μm onto the top surface 102a of the electronic device 102) and/or into defined keep out zones can lead to failures and other problems of the system 100. Thus, when inspection of a system 100 uncovers bleed out or creep of underfill 108 beyond specified limits, an entire lot of systems including the system 100 is commonly scrapped, constituting a waste of resources. In addition, systems of a lot are often randomly sampled for inspection, meaning that although an inspected system 100 of a lot may not include bleed out or creep of the underfill 108 beyond specified limits, other systems of that lot may. Thus, the possibility of experiencing failures or other problems due to bleed out or creep of underfill 108 remains unacceptably high.

One possible solution for reducing bleed out and/or creep of the underfill 108 is to increase the size of a solder resist opening on the substrate into which the underfill 108 can be dispensed. For example, as shown in FIG. 1, the substrate 104 includes a solder resist layer 106 applied over the top surface 104a of the substrate 104. The gaps between (a) the left and right edges of the electronic device 102 and (b) the solder resist layer 106 on a corresponding side of the electronic device 102, represent solder resist openings. Increasing the size of these openings (e.g., by removing portions of the solder resist layer 106 to increase the distance of the solder resist layer 106 from the left and right edges of the electronic device 102) may reduce the amount of bleed out and/or creep of the underfill 108 because more of the underfill 108 can settle on the top surface 104a of the substrate 104 between the solder resist layer 106 and the left and right edges of the electronic device 102. Increasing the solder resist opening, however, can expose electrical contacts 109 and/or other electrical components (e.g., copper in a signal layer of the substrate 104) disposed on (or exposed through) the top surface 104a of the substrate 104. As such, the risk of delamination (a) between the solder resist layer 106 and the top surface 104a of the substrate and/or (b) between the underfill 108 and the top surface 104a, the electrical contacts 109, and/or the other electrical components, can increase.

Therefore, to address the bleed out and creep concerns, substrates of the present technology include solder resist spacers positioned on or over the top surfaces of the substrates (e.g., on or over, or built up from, the solder resist layers). The solder resist spacers can function as a stop or dam to limit the amount of bleed out of underfill as it is dispensed beneath an electronic device. More specifically, an edge of the solder resist spacer facing the electronic device can be placed a set distance away from a nearest edge of the electronic device to limit bleed out of the underfill to a maximum of that distance. Incorporating the solder resist spacer can also facilitate dispensing the underfill a greater distance away an edge of the electronic device. This is expected to reduce, minimize, or eliminate creep of the underfill on top of the electronic device, even as electronic devices become thinner. Use of solder resist spacers to limit bleed out and creep of underfill is also expected to lessen an amount of underfill that is dispensed onto a substrate because lessening the amount of bleed out and/or creep is expected to initially position or settle more of the underfill beneath an electronic device stacked on the substrate. In turn, use of solder resist spacers is expected to shorten the underfill flowing process, thereby increasing the throughput of the number of systems per hour undergoing a complete underfill flowing process.

Additionally, or alternatively, the solder resist spacers can be incorporated into a final system or package. For example, electronic devices can be stacked on top of the solder resist spacers and/or other electronic devices of a system. As a specific example, solder resist spacers can be used in addition to or in lieu of other spacers (e.g., silicon spacers) or supporting structures. Because solder resist material is often cheaper and easier to apply than other materials (e.g., silicon), incorporating solder resist spacers into a final system or package can reduce manufacturing costs.

Specific details of several embodiments of the present technology are described herein with reference to FIGS. 1-5. It should be noted that other embodiments in addition to those disclosed herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "horizontal," "upper," "lower," "top," "above," "left," "right," "below," and "bottom" can refer to relative directions or positions of features in the semiconductor devices in view of the orientation shown in FIGS. 1-5. For example, "bottom" and/or "below" can refer to a feature positioned closer to the bottom of a page than another feature. These terms, however, should be construed broadly to include semiconductor devices having other orientations, such as inverted or inclined orientations where top/bottom, over/under, above/below, up/down, and/or left/right can be interchanged depending on the orientation.

Figure 2:
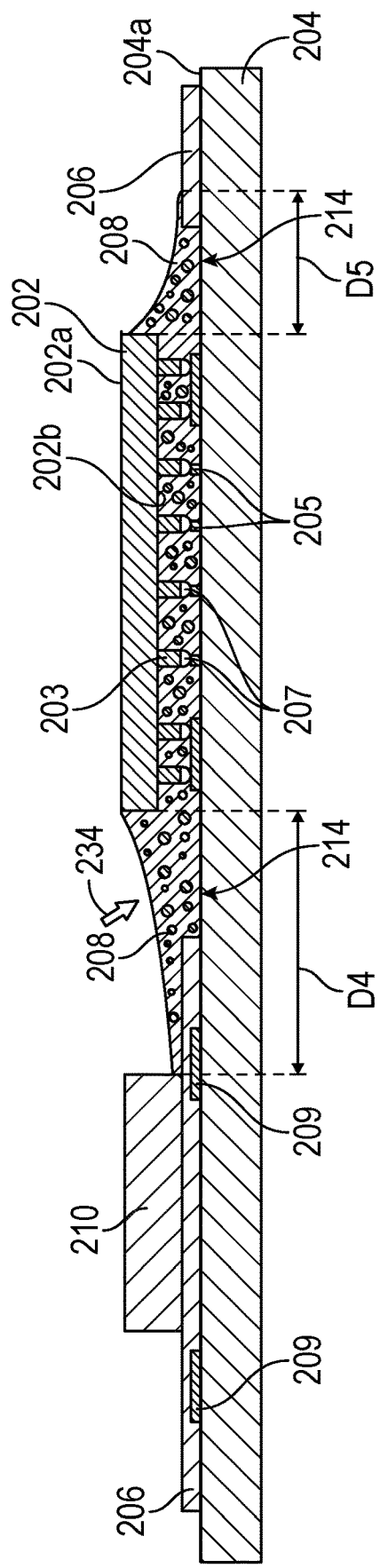
FIG. 2 is a partially schematic side view of a system having an electronic device mounted on a substrate, and configured in accordance with various embodiments of the present technology.

B. Selected Embodiments of Substrates with Solder Resist Spacers, and Associated Systems, Devices, and Methods FIG. 2 is a partially schematic side view of a system 200 configured in accordance with various embodiments of the present technology. As shown, the system 200 includes an electronic device 202 stacked or mounted on or over a substrate 204. More specifically, the electronic device 202 includes a plurality of electrical contacts 203 disposed on (or exposed through) an active side 202b (e.g., an active surface or face, a bottom surface) of the electronic device 202, and the substrate 204 includes a plurality of electrical contacts 205 disposed on (or exposed through) a top surface 204a of the substrate 204. The electrical contacts 203 and/or 205 can be bond pads, bond fingers, traces, and/or other suitable electrical contacts or connectors. Corresponding ones of the electrical contacts 203 and 205 can be coupled to one another using electrical connectors 207, such as solder balls or the like.

In some embodiments, the electronic device 202 can be a chip, semiconductor die, or similar electronic device. For example, the electronic device 202 can include various types of semiconductor components and functional features, such as dynamic random-access memory (DRAM), static random-access memory (SRAM), flash (e.g., NAND or NOR) memory, or other forms of integrated circuit memory, processing circuitry, imaging components, and/or other semiconductor features. In one embodiment, the electronic device 202 is a memory die or a logic die. Additionally, or alternatively, the electronic device 202 can embody a variety of alternative integrated circuit functions. In other embodiments, the electronic device 202 can be or include a controller or processor, such as a field-programmable gate array (FPGA), an application-specific integrated circuit (ASIC), a central processing unit (GPU), a graphics processing unit (GPU), or the like.

The electronic device 202 is illustrated in an active-face-down orientation in FIG. 2. In other embodiments, the electronic device 202 can be arranged in an active-face-up orientation on the substrate 204, and/or the electronic device 202 can include one or more electrical contacts (not shown) on a side 202a (e.g., on a top surface or face) opposite the side 202b of the electronic device 202. Furthermore, although only one electronic device 202 is included in the embodiment illustrated in FIG. 2, systems configured in accordance with other embodiments of the present technology can include a greater number (e.g., more than one) of electronic devices 202. The plurality of electronic devices 202 can be arranged side-by-side on the substrate 204, and/or the electronic devices 202 can be stacked such that at least one of the electronic devices 202 is placed on top of another of the electronic devices 202.

The substrate 204 can be a printed circuit board (PCB), a package substrate, an interposer, an interconnector, a dielectric spacer, a redistribution structure, or the like. As shown, the substrate 204 includes a plurality of electrical contacts 209 disposed on (or exposed through) the top surface 204a of the substrate 204. The electrical contacts 209 can be bond pads, bond fingers, traces, and/or other suitable electrical contacts or connectors. A solder resist layer 206 is disposed on the top surface 204a of the substrate 204 and over the electrical contacts 209.

The substrate 204 further includes a spacer 210 disposed or formed (e.g., built up) on the solder resist layer 206 and laterally offset or spaced apart from the electronic device 202. In the illustrated embodiment, the spacer 210 is also formed or composed at least in part of solder resist. Having the solder resist layer 206 and the spacer 210 both comprising solder resist can reduce the risk of delamination between the spacer 210 and the solder resist layer 206. In other embodiments, the spacer 210 can be formed of one or more other materials, such as one or more other materials that are compatible with the solder resist layer 206 to reduce the risk of delamination.

In some embodiments, the spacer 210 can be disposed or formed on the solder resist layer 206 during substrate fabrication. For example, in embodiments in which the spacer 210 is formed of solder resist, additional solder resist printing (e.g., with low viscosity) can be used to form the spacer 210 after or while forming the solder resist layer 206 on the top surface 204a of the substrate 204. The spacer 210 can be formed such that a final thickness or height of the spacer 210 corresponds to (a) a thickness or height of an electronic device 202 to be mounted on the substrate 204 and/or (b) a height of the top surface 202a of the electronic device 202 from the top surface 204a of the substrate 204. For example, thicker or taller spacers 210 can be used for thicker or taller electronic devices 202. In some embodiments, a thickness or height of the spacer 210 can be greater than or equal to a thickness or height of the electronic device 202 and/or to the height of the top surface 202a of the electronic device 202 from the top surface 204a of the substrate 204. As discussed in greater detail below with reference to FIG. 3, this can facilitate stacking other components (e.g., other electronic devices) of a system on or over the spacer 210 and/or the top surface 202a of the electronic device 202. In other embodiments, a thickness or height of the spacer 210 can be less than the thickness or height of the electronic device 202 and/or than the height of the top surface 202a of the electronic device 202 from the top surface 204a of the substrate 204.

As shown in FIG. 2, underfill 208 (e.g., a polymer or epoxy) can be disposed underneath the electronic device 202 between the electronic device 202 and the top surface 204a of the substrate 204. The underfill 208 can be used to protect or reenforce the electrical connections formed between the electrical contacts 203 disposed on (or exposed through) the bottom surface 202b of the electronic device 202 and the electrical contacts 205 disposed on (or exposed through) the top surface 204a of the substrate 204. Additionally, or alternatively, the underfill 208 can be used to reinforce the system 200 against shock, vibratory stress, and/or thermal stress.

While dispensing and flowing the underfill 208, the spacer 210 can function as a stop or dam to limit bleed out (lateral spread) of the underfill 208 away from the electronic device 202. More specifically, the spacer 210 can be positioned on the substrate 204 such that a front edge or face of the spacer 210 (e.g., an edge or face of the spacer 210 closest to or directed toward the electronic device 202) is positioned a distance D4 away from a nearest edge of the electronic device 202. As the underfill 208 is dispensed and a portion of the underfill 208 bleeds out away from the electronic device 202, the spacer 210 prevents bleed out of the underfill 208 beyond the front face of the spacer 210. In particular, as the underfill 208 bleeds out away from the electronic device 202, the underfill 208 can come into contact with or abut up against the front face of the spacer 210, and the front face of the spacer 210 can stop further bleed out of the underfill 208. The distance D4 can therefore represent a maximum distance the underfill 208 is permitted to bleed out from the edge of the electronic device 202 at a side of the electronic device 202 at which the underfill 208 is dispensed onto the substrate 204. In some embodiments, the distance D4 can be less than or equal to 900 μm, 700 μm, 500 μm, or another specified distance.

In some embodiments, the underfill 208 can be dispensed onto the substrate 204 from a location generally shown by arrow 234. Comparing the system 200 of FIG. 2 to the system 100 of FIG. 1, the arrow 234 in FIG. 2 is positioned further from the electronic device 202 than the arrow 134 in FIG. 1 is positioned from the electronic device 102. In other words, because the spacer 210 of FIG. 2 limits bleed out of the underfill 208 in the direction away from the electronic device 202, the underfill 208 can be dispensed onto the substrate 204 at a location 234 farther from the electronic device 202 than the location 134 from the electronic device 102, without risk of bleed out of the underfill 208 beyond the front face of the spacer 210. In some embodiments, the underfill 208 can be dispensed at a location 234 at least 5 percent, 10 percent, 20 percent, 25 percent, 35 percent, 40 percent, 50 percent, 60 percent, 75 percent, or more of the distance away from the edge of the electronic device 202 toward the spacer 210. As a specific example, the underfill 208 can be dispensed at a location 234 that is approximately 150 μm to approximately 225 μm (e.g., about 175 μm to about 200 μm, or about 190 μm) away from the electronic device 202 toward the spacer 210, or more. In these and other embodiments, the underfill 208 can be dispensed at a location 234 over a solder resist opening 214 in the solder resist layer 206, between an edge of the solder resist layer 206 and the edge of the electronic device 202 nearest the spacer 210. In other embodiments, the underfill 208 can be dispensed at a location above the solder resist layer 206 and a distance away from a nearest edge of the solder resist opening 214 toward the spacer 210.

Increasing the distance of the dispense point of the underfill 208 from the electronic device 202 is expected to decrease the amount of underfill 208 that piles up at, adjacent, or beneath the edges of the electronic device 202 while the underfill 208 is dispensed and flown. In turn, less underfill 208 is expected to reach up to and/or creep onto the top surface 202a of the electronic device 202. In other words, the spacer 210 is expected (a) to limit bleed out of the underfill 208 away from the electronic device 202, and (b) to enable distancing the dispense point of the underfill 208 away from the electronic device 202 such that creep of the underfill 208 onto the top surface 202a of the electronic device 202 is reduced, minimized, or eliminated.

In some embodiments, distancing the dispense point of the underfill 208 away from the electronic device 202 is also expected to reduce the amount of bleed out of the underfill 208 away from an edge of the electronic device 202 opposite the dispense point. For example, as shown in FIG. 2, the underfill 208 is shown as having bled out a distance D5 from the electronic device 202, which is less than the distance D2 of FIG. 1. In some embodiments, an additional spacer (not shown in FIG. 2) identical or generally similar to the spacer 210 can be positioned on the substrate 204 on a side of the electronic device 202 opposite the spacer 210 in FIG. 2. More specifically, the additional spacer can be positioned on the solder resist layer 206 and/or the top surface 204a of the substrate 204 such that an edge or face of the additional spacer facing the electronic device 202 is positioned a specified distance away from a nearest edge of the electronic device 202. Thus, as the underfill 208 is dispensed and a portion of the underfill 208 bleeds out away from the electronic device 202 towards the additional spacer, the additional spacer can prevent bleed out of the underfill 208 beyond the face of the additional spacer directed toward the electronic device 202. In particular, as the underfill 208 bleeds out away from the electronic device 202 towards the additional spacer, the underfill 208 can come into contact with and abut up against the face of the additional spacer, and the face of the additional spacer can stop further bleed out of the underfill 208 in the direction away from the electronic device 202 toward the additional spacer. The distance of the face of the additional spacer from the electronic device 202 can therefore represent a maximum distance the underfill 208 is permitted to bleed out from the edge of the electronic device 202 nearest the additional spacer. In some embodiments, the distance can be less than or equal to 500 μm or another specified distance.

Because the spacer 210 and/or the additional spacer limit or reduce bleed out and/or creep of the underfill 208, it is expected that a lesser amount of underfill 208 will be dispensed onto the substrate 204 of the system 200 than onto the substrate 104 of the system 100 of FIG. 1 because a greater amount of the underfill 208 will be positioned beneath the electronic device 202 and about the electrical connections between the electrical contacts 203 and the electrical contacts 205. Dispensing a lesser amount of underfill 208 is expected to increase the speed with which the underfill flowing process can be completed. In turn, the present technology is expected to increase throughput of the number of systems 200 per hour undergoing a complete underfill flowing process.

Furthermore, because the spacer 210 and/or the additional spacer limit or reduce bleed out and/or creep of the underfill 208 within the system 200, the present technology is expected to reduce, minimize, or eliminate the occurrence of failures or other problems that can occur as a result of bleed out and/or creep of the underfill 208 beyond specified limits. Additionally, or alternatively, the present technology is expected to reduce the number of systems 200 that are rejected after inspection for bleed out and/or creep of the underfill 208 beyond specified limits, thereby reducing the number of systems and/or amount of material scrapped because of bleed out and/or creep of the underfill 208 beyond the specified limits.

In some embodiments, after the underfill 208 is dispensed and flown and/or allowed to set or cure, the spacer 210 and/or the additional spacer can be removed from the solder resist layer 206 and/or the top surface 204a of the substrate 204. For example, the spacer 210 and/or the additional spacer can be removed before, during, or after electrical contacts 209 disposed on (or exposed through) the substrate 204 are exposed through the solder resist layer 206. In other embodiments, the spacer 210 and/or the additional spacer can be (a) left on the solder resist layer 206 and/or the top surface 204a of the substrate 204, and/or (b) incorporated into the final system 200 or package. For example, as discussed in greater detail below with reference to FIG. 3, the spacer 210 and/or the additional spacer can be used to stack other components (e.g., other electronic devices) of a system on or over the spacer 210 and/or the top surface 202a of the electronic device 202.

Figure 3:
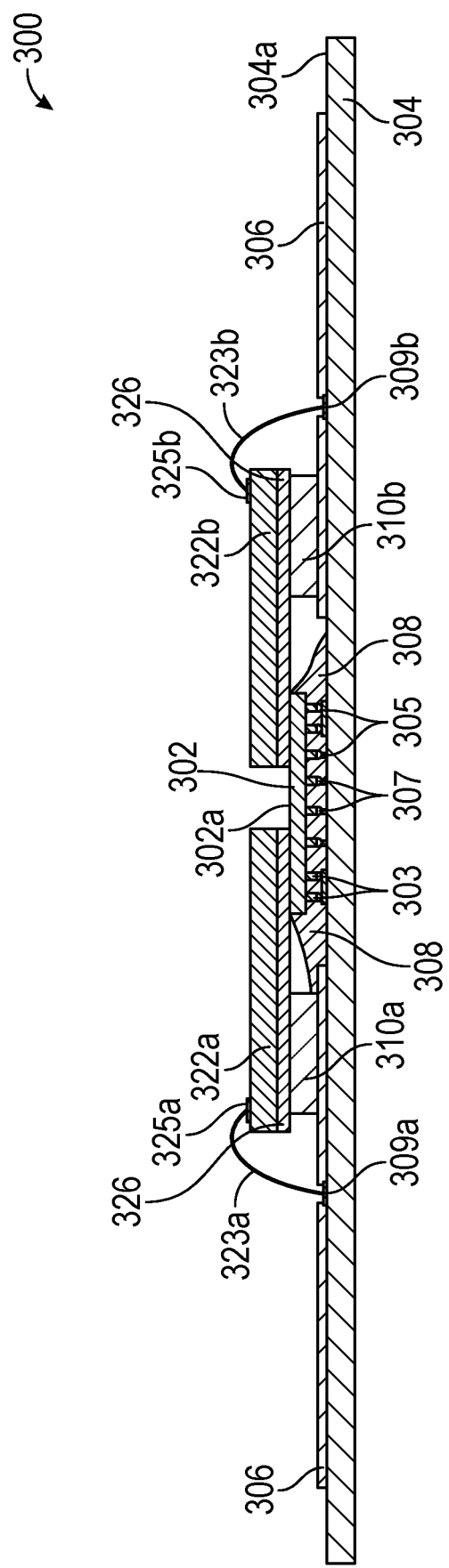
FIG. 3 is a partially schematic side view of another system having an electronic device mounted on a substrate, and configured in accordance with various embodiments of the present technology.

FIG. 3 is a partially schematic side view of another system 300 configured in accordance with various embodiments of the present technology. The system 300 is generally similar to the system 200 of FIG. 2. Indeed, similar reference numbers are used in FIG. 3 as those used in FIG. 2 to indicate identical or generally similar components. Therefore, a detailed discussion of these identical and/or generally similar components in FIG. 3 is largely omitted below for the sake of brevity.

As shown, the system 300 includes an electronic device 302 mounted on a top surface 304a of a substrate 304. As discussed above, the electronic device 302 can be a chip, semiconductor die, a controller, or a similar electronic device; and the substrate 304 can be a PCB, a package substrate, an interposer, an interconnector, a dielectric spacer, a redistribution structure, or the like. As a specific example, the electronic device 302 can be a controller, and the substrate 204 can be a PCB.

The system 300 further includes two spacers 310 (identified individually as first spacer 310a and second spacer 310b) stacked on a solder resist layer 306 of the substrate 304. Similar to the spacer 210 described in detail above with reference to FIG. 2, the spacers 310 of FIG. 3 can function as stops or dams to limit bleed out of underfill 308 away from the electronic device 302 and/or to reduce creep of the underfill 308 onto a top surface 302a of the electronic device 302. In the illustrated embodiment, the spacers 310 are formed or composed at least in part of solder resist such that they are compatible with the solder resist layer 306 with little risk of delamination. Solder resist is relatively inexpensive in comparison to other materials (e.g., silicon) that can be employed to form the spacers 310. As such, using spacers 310 composed at least in part of solder resist is expected to reduce or minimize manufacturing costs of the system 300. In addition, by incorporating the solder resist spacers 310 into the final system 300 or package (e.g., after using the spacers 310 as dams to limit bleed out of the underfill 308), the assembly process of the system 300 can be shorter in duration than the assembly process used to form another system that removes the solder resist spacers and replaces them with alternative spacers. In other embodiments, the spacers 310 can include and/or be composed at least in part of one or more other materials, such as one or more other materials that are compatible with the solder resist layer 306 to limit delamination between the spacers 310 and the solder resist layer 306.

As shown, the spacers 310 are uniformly sized and/or shaped, and each of the spacers 310 includes a height such that a top surface of the respective spacer 310 is positioned generally flush with the top surface 302a of the electronic device 302. In other embodiments, the spacers 310 can include sizes and/or shapes that vary from one another. In these and other embodiments, one or more of the spacers 310 can include a height such that the top surface of the respective spacer 310 is positioned above or below the top surface 302a of the electronic device 302.

The system 300 further includes a plurality of electronic devices 322 (identified individually as first electronic device 322a and second electronic device 322b) stacked on or over the spacers 310 and the top surface 302a of the electronic device 302. In some embodiments, a die attach film 326 or other material can be used to mount the electronic devices 322 on top of the spacers 310 and/or the electronic device 302. In other embodiments, electrical connectors (not shown) can be used to electrically couple electrical contacts (not shown) disposed on (or exposed through) a bottom surface of the electronic devices 322 to electrical contacts (now shown) disposed on (or exposed through) a top surface of the spacers 310 and/or the top surface 302a of the electronic device 302.

In some embodiments, the electronic devices 322 can be a chip, semiconductor die, or similar electronic device. For example, the electronic devices 322 can include various types of semiconductor components and functional features, such as dynamic random-access memory (DRAM), static random-access memory (SRAM), flash (e.g., NAND or NOR) memory, or other forms of integrated circuit memory, processing circuitry, imaging components, and/or other semiconductor features. In one embodiment, the electronic devices 322 are memory dies or a logic dies. Additionally, or alternatively, the electronic devices 322 can embody a variety of alternative integrated circuit functions. In other embodiments, the electronic devices 322 can be or include a controller or processor, such as a field-programmable gate array (FPGA), an application-specific integrated circuit (ASIC), a central processing unit (GPU), a graphics processing unit (GPU), or the like. As a specific example, the electronic devices 322 can be NAND memory dies that are controlled by the electronic device 302.

In the illustrated embodiment, each of the electronic devices 322 includes an electrical contact 325 (identified individually as first electrical contact 325a and second electrical contact 325b) disposed on (or exposed through) an active side (e.g., an active surface or face, a top surface) of the respective electronic device 322. The electrical contacts 325 can be bond pads, bond fingers, traces, and/or other suitable electrical contacts or connectors. The substrate 304 further includes electrical contacts 309 (identified individually as first electrical contact 309a and second electrical contact 309b) disposed on (or exposed through) the top surface 304a of the substrate 304. As shown, the electrical contacts 309 are exposed through the solder resist layer 306 and are each coupled to a respective one of the electrical contacts 325 via a corresponding wire bond 323 (identified individually as first wire bond 323a and second wire bond 323b).

The electronic devices 322 are each illustrated in an active-face-up orientation in FIG. 3. In other embodiments, one or more of the electronic devices 322 can be arranged in an active-face-down orientation, and/or one or more of the electronic devices 322 can include one or more electrical contacts (not shown) on a side (e.g., on a bottom surface or face) opposite the side of the electronic devices 322 at which the electrical contacts 325 are positioned. Furthermore, although the system 300 is illustrated as having two electronic devices 322 in FIG. 3, systems configured in accordance with other embodiments of the present technology can include a greater (e.g., more than two) or lesser (e.g., one or zero) number of electronic devices 322. Additionally, or alternatively, although shown arranged side-by-side in the system 300, and/or the electronic devices 322 can be stacked such that at least one of the electronic devices 322 is placed on top of the other of the electronic devices 322 in other embodiments of the present technology.

Figure 4:
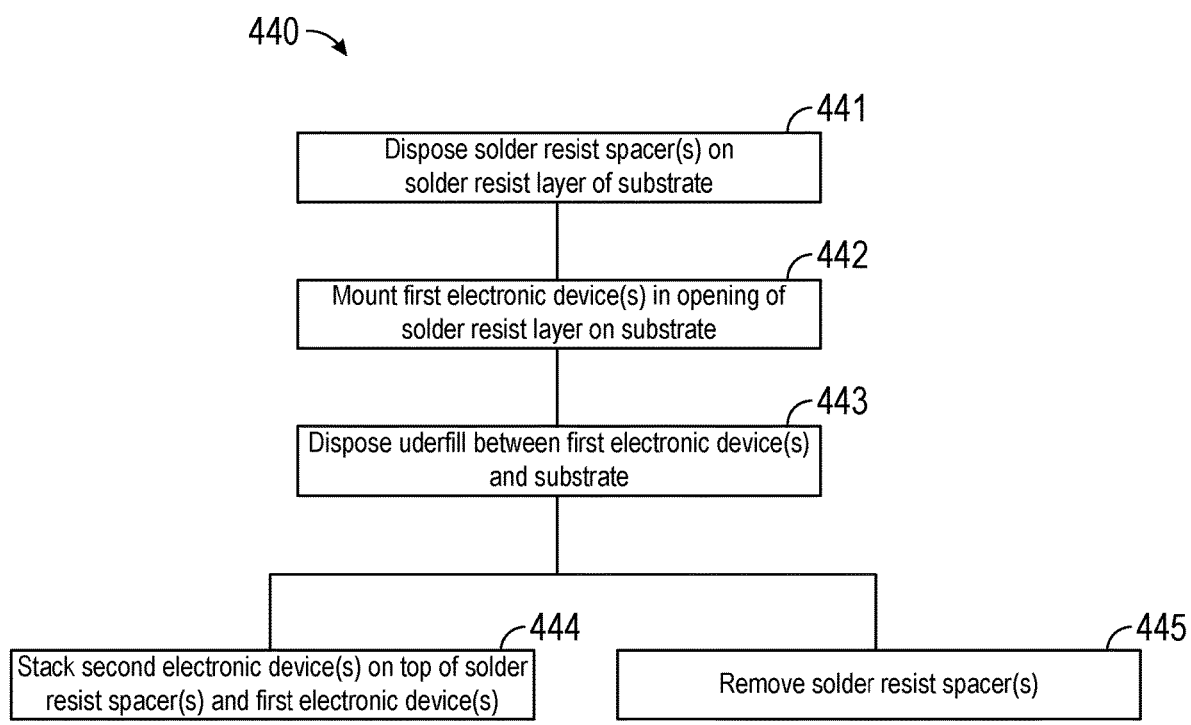
FIG. 4 is a flow diagram illustrating a method of manufacturing a system in accordance with various embodiments of the present technology.

FIG. 4 is a flow diagram illustrating a method 440 of manufacturing a system in accordance with various embodiments of the present technology. The system can be the system 200 of FIG. 2, the system 300 of FIG. 3, or another system of the present technology. The method 440 is illustrated as a series of steps or blocks 441-445. All or a subset of one or more of the blocks 441-445 can be executed in accordance with the discussion above.

The method 440 begins at block 441 by disposing (e.g., forming, building up) at least one solder resist spacer on a solder resist layer of a substrate. Disposing the solder resist spacer(s) can include disposing the solder resist spacer(s) (a) during or after fabrication of the substrate and/or (b) during or after disposing the solder resist layer on the substate. The solder resist layer can be positioned at a first side of the substrate, and can include an opening in which an electronic device can be mounted to the substrate at block 442. The solder resist spacers can be disposed at one or more locations laterally offset or spaced apart from the opening in the solder resist layer. For example, a first solder resist spacer can be disposed laterally spaced apart from a first side of the opening corresponding to a side of the opening at which underfill is disposed at block 443. Additionally, or alternatively, a second solder resist spacer can be disposed laterally spaced apart from a second side of the opening opposite the first side. Disposing or forming the solder resist spacer(s) can include printing solder resist (e.g., with low viscosity) or otherwise building up or forming the solder resist spacer(s) on top of the solder resist layer. A height of a top surface of one or more of the solder resist spacer(s) can correspond to a thickness of the electronic device mounted to the substrate at block 442, and/or can be greater than or equal to a height at which a top surface of the electronic device is positioned when mounted to the substrate.

At block 442, the method 440 continues by mounting one or more first electronic device(s) on the substrate in an opening of the solder resist layer. Examples of a first electronic device include a controller (e.g., a memory controller or an ASIC) and/or a chip or semiconductor die (e.g., a memory die, a logic die). Mounting the first electronic device(s) on the substrate can include mounting the first electronic device(s) in the opening of the solder resist layer discussed above with reference to block 441. Mounting the first electronic device(s) on the substrate can include coupling electrical contacts at active face(s) or side(s) of the first electronic device(s) to corresponding electrical contacts at the first side of the substrate (e.g., using solder). When mounted to the substrate, the first electronic device(s) can be laterally offset and spaced apart from the solder resist spacer(s).

At block 443, the method 440 continues by disposing underfill between the first electronic device(s) and the substrate. Disposing underfill can include disposing underfill in the opening of the solder resist layer between the active side(s) of the first electronic device(s) and the first side of the substrate. Disposing underfill can include disposing underfill about electrical connections formed between electrical contacts at the active side(s) of the first electronic device(s) and electrical contacts at the first side of the substrate. Disposing underfill can include disposing underfill at a first side of the opening in the solder resist layer discussed above with reference to block 441, and/or from a location that is greater than 150 μm away from an edge of the first electronic device(s) nearest the first side of the opening. Disposing underfill can include using the solder resist spacer(s) to limit bleed out of the underfill laterally away from the first electronic device(s).

In some embodiments, the method 440 continues at block 444 by stacking one or more second electronic devices on top of one or more of the solder resist spacers and/or the first electronic device(s). An example of a second electronic device includes a chip or semiconductor die (e.g., a memory die, a logic die). As a specific example, the first electronic device(s) of block 442 can include a memory controller or a logic die, and the second electronic device(s) can include one or more memory dies. A second electronic device can be stacked on top of a first solder resist spacer, a first electronic device, and/or a second solder resist spacer. As a specific example, a second electronic device can be stacked on top of the first solder resist spacer and a first portion of a first electronic device of block 442 (e.g., using a die attach film or other suitable attachment methodology). Additionally, or alternatively, another second electronic device can be stacked on top of a second solder resist spacer (e.g., a solder resist spacer positioned on a side of the first electronic device opposite the first solder resist spacer) and a second portion of the first electronic device (e.g., using a die attached film or other suitable attachment methodology). As another specific example, a second electronic device can be stacked on top of the first solder resist spacer, the first electronic device, and the second solder resist spacer (e.g., such that the second electronic device spans an entire distance across a top surface of the first electronic device and/or has a footprint larger than a footprint of the first electronic device).

Stacking the one or more second electronic devices can include exposing electrical contacts at a first side of the substrate through the solder resist layer. In these embodiments, electrical contacts at active face(s) or side(s) of the second electronic device(s) can be coupled (e.g., using wire bonds or other suitable electrical connectors) to the electrical contacts at the first side of the substrate that are exposed through the solder resist layer. The active face(s) or side(s) of the one or more of the second electronic device(s) can be oriented in a direction away from the first side of the substrate.

In some embodiments, the method 440 continues at block 445 (e.g., from block 443 or from block 444) by removing one or more of the solder resist spacers. Removing the solder resist spacer(s) can include removing all of the solder resist spacers disposed at block 441. In other embodiments, removing the solder resist spacer(s) can include removing a subset of the solder resist spacers disposed at block 441.

Although the steps of the method 440 are discussed and illustrated in a particular order, the method 440 is not so limited. In other embodiments, the method 440 can be performed in a different order. For example, block 442 can be performed before block 441. In these and other embodiments, any of the steps 441-445 of the method 440 can be performed before, during, and/or after any of the other steps 441-445 of the method 440. Furthermore, the method 440 can be altered and still remain within these and other embodiments of the present technology. For example, one or more steps 441-445 of the method 440 can be omitted and/or repeated in some embodiments. As a specific example, block 444 and/or block 445 can be omitted in some embodiments.

Figure 5:
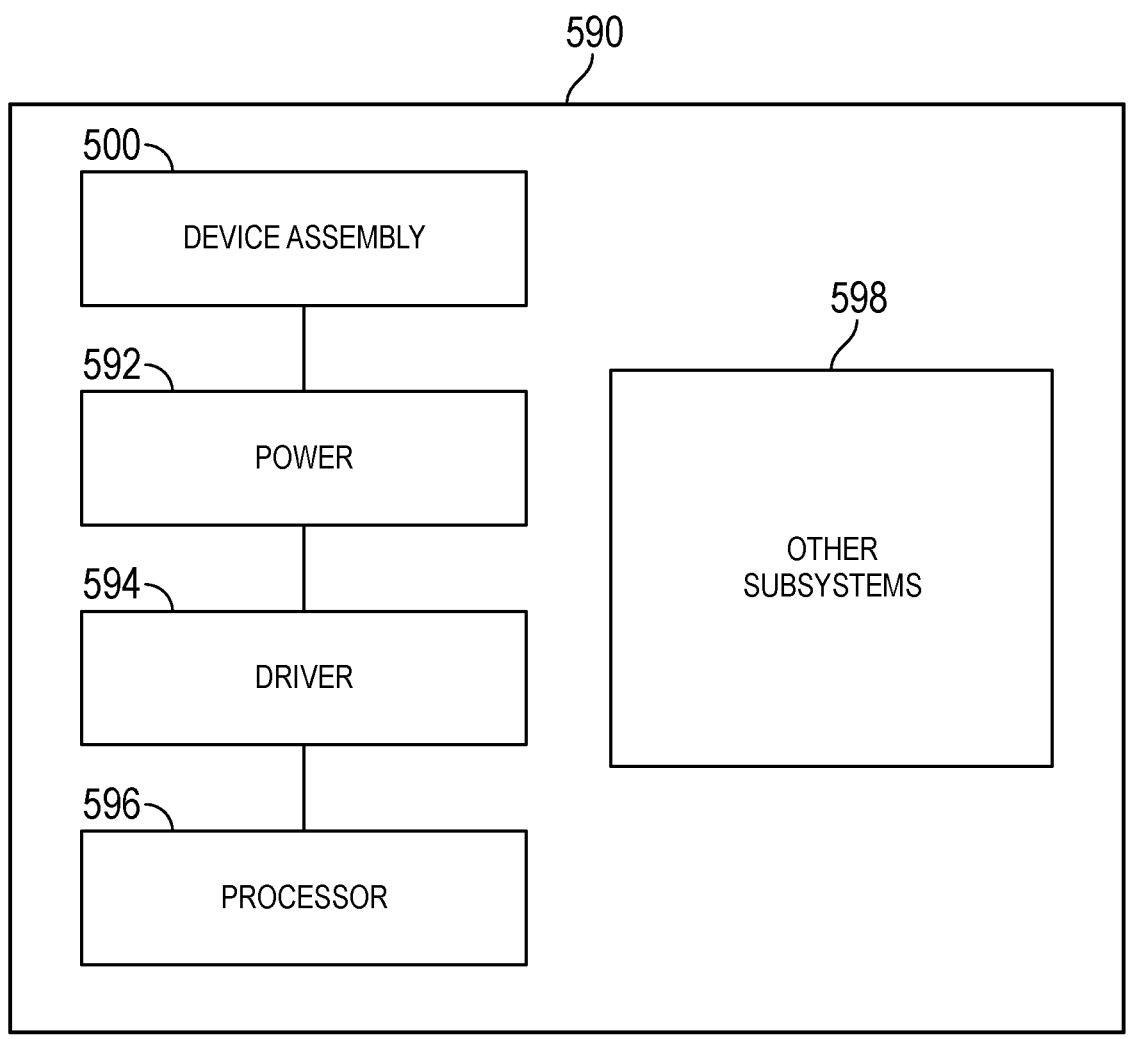
FIG. 5 is a schematic view of a system that includes a semiconductor device configured in accordance with various embodiments of the present technology.

Any of the substrates and/or systems described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems or components 598. The semiconductor device assembly 500 can include semiconductor devices with features generally similar to those of the substrates and/or systems described above. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. As used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same feature(s) and/or additional types of other features are not precluded. Moreover, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. As another example, various components of the technology can be further divided into subcomponents, and/or various components and/or functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the present technology.

It should also be noted that other embodiments in addition to those disclosed herein are within the scope of the present technology. For example, embodiments of the present technology can have different configurations, components, and/or procedures in addition to those shown or described herein. Moreover, a person of ordinary skill in the art will understand that these and other embodiments can be without several of the configurations, components, and/or procedures shown or described herein without deviating from the present technology. Accordingly, the disclosure and associated technology can encompass other embodiments not expressly shown or described herein.

What is claimed is:

1. A system, comprising:
   a substrate including a plurality of first electrical contacts at a first surface of the substrate;
   a first electronic device including a plurality of second electrical contacts at a first surface of the first electronic device, and wherein the first electronic device is mounted on the first surface of the substrate such that electrical connections are formed between individual ones of the plurality of second electrical contacts and corresponding ones of the plurality of first electrical contacts;
   a solder resist spacer disposed on the first surface of the substrate and laterally spaced apart from the first electronic device;
   underfill disposed (a) between the first surface of the first electronic device and the first surface of the substrate, and (b) about at least some of the electrical connections; and
   a second electronic device mounted on top of the solder resist spacer and the first electronic device,
   wherein:
      the solder resist spacer is configured as a dam to limit bleed out of the underfill laterally away from the first electronic device toward the solder resist spacer and along the first surface of the substrate,
      the first electronic device is a memory controller, and the second electronic device is a memory die.

2. The system of claim 1, wherein the substrate further includes a solder resist layer disposed on the first surface of the substrate, and wherein the solder resist spacer is disposed on top of the solder resist layer.

3. The system of claim 1, wherein at least a portion of the underfill abuts up against a face of the solder resist spacer directed toward the first electronic device.

4. The system of claim 1, wherein the solder resist spacer includes a height corresponding to a thickness of the first electronic device such that a top surface of the solder resist spacer is generally level with a second surface of the first electronic device opposite the first surface of the first electronic device while the first electronic device is mounted on the first surface of the substrate.

5. The system of claim 1, wherein the substate is a package substrate or a printed circuit board (PCB).

6. The system of claim 1, wherein the second electronic device is a NAND memory die.

7. The system of claim 1, wherein:
   the second electronic device includes an electrical contact at a surface of the second electronic device opposite the substrate;
   the substrate further includes an electrical contact at the first surface of the substrate at a side of the spacer opposite the first electronic device; and
   the system further includes a wire bond coupling the electrical contact of the second electronic device to the electrical contact of the substrate.

8. The system of claim 1, wherein:
   the solder resist spacer is a first solder resist spacer laterally spaced apart from a first side of the first electronic device;
   the system further comprises a second solder resist spacer disposed on the first surface of the substrate and laterally spaced apart from a side second of the first electronic device opposite the first side.

9. The system of claim 8, wherein the second solder resist spacer is configured as a second dam to limit bleed out of the underfill laterally away from the first electronic device toward the second solder spacer and along the first surface of the substrate.

10. The system of claim 1, wherein the second electronic device is mounted on top of the solder resist spacer and the first electronic device such that (i) a first side of the second electronic device is positioned within a footprint of the first electronic device and (ii) a second side of the second electronic device opposite the first side is positioned outside a footprint of the first electronic device.

11. The system of claim 8, further comprising a third electronic device mounted on top of the second solder resist spacer and the first electronic device such that (i) the second and third electronic devices are arranged side-by-side one another over the first electronic device.

12. The system of claim 1, wherein the second electronic device is arranged in an active-face-down orientation on the first electronic device, and wherein the second electronic device is mounted on the first electronic device such that electrical contacts at a first surface of the second electronic device facing the first electronic device are coupled to electrical contact at a second surface of the first electronic device opposite the first surface of the first electronic device.

13. The system of claim 1, wherein the second electronic device is mounted is arranged in an active-face-down orientation on the first electronic device, and wherein the second electronic device is mounted on the solder resist spacer such that an electrical contact at a first surface of the second electronic device facing the solder resist spacer is coupled to an electrical contact at a top surface of the solder resist spacer.

14. A system, comprising:
   a substrate, a first electronic device mounted on a first surface of the substrate, and a second electronic device and third electronic device that are each mounted on the first electronic device,
   wherein the substrate includes
      a solder resist layer disposed over at least a portion of the first surface, a plurality of electrical contacts at the first surface of the substrate and electrically coupled to corresponding electrical contacts at a first surface of the first electronic device, a first solder resist spacer disposed on the solder resist layer at a first location laterally offset from a first side of the first electronic device, wherein the first solder resist spacer has a height corresponding to a thickness of the first electronic device, and wherein the first solder resist spacer is configured as a dam to limit bleed out of underfill laterally away from the plurality of electrical contacts along the first surface of the substrate and toward the first solder resist spacer, and a second solder resist spacer disposed on the solder resist layer at second location laterally offset from a second side of the first electronic device opposite the first side such that the first and second solder resist spacers flank the first electronic device, wherein the second solder resist spacer has a height corresponding to the thickness of the first electronic device, and wherein the second solder resist spacer is configured as a dam to limit bleed out of underfill laterally away from the plurality of electrical contacts along the first surface of the substrate and toward the second solder resist spacer, wherein the second electronic device is further mounted on the first solder resist spacer without being mounted on the second solder resist spacer, and wherein the third electronic device is further mounted on the second solder resist spacer without being mounted on the first solder resist spacer.

15. A method of manufacturing a system comprising a substrate, a first electronic device, and a second electronic device, the method comprising:

disposing a solder resist spacer on a solder resist layer of the substrate, the solder resist layer disposed over at least a portion of a first surface of the substrate;

mounting the first electronic device in an opening of the solder resist layer and on the first surface of the substrate such that first electrical contacts at a first surface of the first electronic device are electrically coupled to second electrical contacts at the first surface of the substrate at a location along the first surface of the substrate laterally spaced apart from the solder resist spacer;

dispensing underfill such that (a) at least a portion of the underfill is positioned (i) between the first electronic device and the first surface of the substrate and (ii) about at least some electrical connections formed between the first and second electrical contacts, and (b) bleed out of the underfill in a direction laterally away from the first electronic device along the first surface of the substrate is limited by a face of the solder resist spacer directed toward the first electronic device; and mounting the second electronic device on the solder resist spacer and the first electronic device such that a first side of the second electronic device is vertically aligned with the first electronic device and a second side of the second electronic device opposite the first side is not vertically aligned with the first electronic device.

16. The method of claim 15, wherein disposing the solder resist spacer include printing solder resist onto the solder resist layer with low viscosity.

17. The method of claim 15, wherein:

disposing the solder resist spacer includes disposing the solder resist spacer such that a top surface of the solder resist spacer is positioned at a first height above the first surface of the substrate;

the first height corresponds to a position of a second surface of the first electronic device above the first surface of the substrate when the first electronic device is mounted to the first surface of the substrate; and the second surface of the first electronic device is opposite the first surface of the first electronic device.

18. The method of claim 15, wherein dispensing the underfill includes dispensing the underfill from a location that is between the first electronic device and the solder resist spacer and that is greater than 150 μm away from an edge of the first electronic device nearest the solder resist spacer.

19. The method of claim 15, wherein:

the solder resist spacer is a first solder resist spacer; and the method further comprises— disposing a second solder resist spacer on the solder resist layer of the substrate and at a side of the first electronic device opposite the first solder resist spacer, and mounting a third electronic device on the second solder resist spacer and the first electronic device such that (i) a first side of the third electronic device is vertically aligned with the first electronic device and a second side of the third electronic device opposite the first side is not vertically aligned with the first electronic device, and (ii) the second and third electronic devices are arranged side-by-side over the first electronic device.

20. The method of claim 15, wherein:

the solder resist spacer is a first solder resist spacer;

the method further comprises disposing a second solder resist spacer on the solder resist layer of the substrate and at a side of the first electronic device opposite the first solder resist spacer; and dispensing the underfill includes dispensing the underfill such that the second solder resist spacer limits bleed out of the underfill away from the first electronic device along the first surface of the substrate toward the second solder resist layer.

* * * * *